United States Patent
Giebeler et al.

(10) Patent No.: US 8,487,257 B2
(45) Date of Patent: Jul. 16, 2013

(54) DEVICE WITH A SANDWICH STRUCTURE FOR DETECTING THERMAL RADIATION, AND METHOD FOR THE PRODUCTION THEREOF

(75) Inventors: Carsten Giebeler, Edinburgh (GB); Matthias Schreiter, Munich (DE); Jörg Zapf, Munich (DE)

(73) Assignee: Pyreos Ltd., Edinburgh (GB)

( * ) Notice: Subject to any disclaimer, the term of this patent is extended or adjusted under 35 U.S.C. 154(b) by 524 days.

(21) Appl. No.: 12/601,613

(22) PCT Filed: May 28, 2008

(86) PCT No.: PCT/EP2008/004247
§ 371 (c)(1),
(2), (4) Date: Jun. 24, 2010

(87) PCT Pub. No.: WO2008/145354
PCT Pub. Date: Dec. 4, 2008

(65) Prior Publication Data
US 2010/0264311 A1  Oct. 21, 2010

(30) Foreign Application Priority Data
May 29, 2007 (DE) .......................... 10 2007 024 903

(51) Int. Cl.
*G01J 5/00* (2006.01)
(52) U.S. Cl.
USPC ................. 250/338.3; 250/338.4; 250/339.01
(58) Field of Classification Search
USPC ................. 250/338.3, 338.4, 339.02, 390.01, 250/391; 257/21, 440, 25, 23
See application file for complete search history.

(56) References Cited

U.S. PATENT DOCUMENTS

| | | | |
|---|---|---|---|
| 5,118,944 A | 6/1992 | Mori et al. | |
| 5,521,123 A | 5/1996 | Komatsu et al. | |
| 5,729,019 A | 3/1998 | Krafthefer et al. | |
| 5,962,854 A | 10/1999 | Endo | |
| 6,655,834 B1 | 12/2003 | Frey et al. | |
| 7,402,897 B2 * | 7/2008 | Leedy | ............................ 257/678 |
| 2004/0173751 A1 | 9/2004 | Komobuchi et al. | |
| 2005/0274892 A1 | 12/2005 | Oda | |
| 2006/0063462 A1 | 3/2006 | Ding et al. | |

FOREIGN PATENT DOCUMENTS

| DE | 195 25 071 A1 | 1/1997 |
|---|---|---|
| DE | 100 04 216 A1 | 8/2001 |
| DE | 10 2004 020 685 B3 | 9/2005 |
| JP | 6-213708 | 8/1994 |

(Continued)

*Primary Examiner* — Edwyn Labaze
(74) *Attorney, Agent, or Firm* — Sughrue Mion, PLLC

(57) ABSTRACT

In a device for the detection of thermal radiation and a method for production of such a device, a stack is formed with a detector support having a detector element for converting the thermal radiation into an electric signal, a circuit support with a read-out circuit for reading out the electrical signal and a cover to shield the detector element. The detector support and the cover are so arranged that a first stack cavity is formed between the detector element and the cover and a second stack cavity is formed between detector support and the circuit support. The first stack cavity and/or the second stack cavity is evacuated and hermetically sealed. In the manufacturing operation, functionalized silicon-substrates are stacked upon one another, firmly bonded together and subsequently sub-divided. Preferably, the detector elements are pyro-electric detector elements. The device finds application in motion detectors, presence reporters and thermal-image cameras.

20 Claims, 2 Drawing Sheets

FOREIGN PATENT DOCUMENTS

| | | |
|---|---|---|
| JP | 2000-502798 A | 3/2000 |
| JP | 2001-174324 A | 6/2001 |
| WO | WO 02/43154 A1 | 5/2002 |
| WO | WO 2007/000172 A1 | 1/2007 |

* cited by examiner

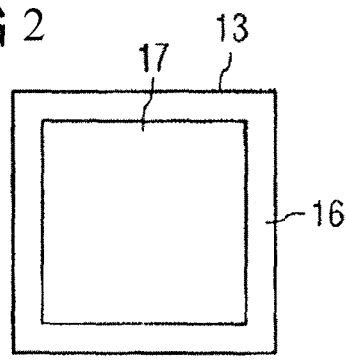
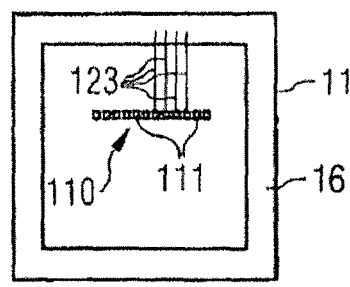
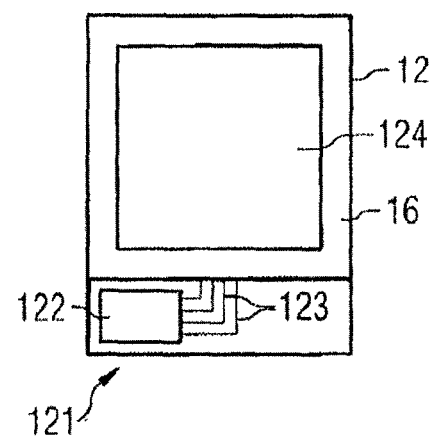
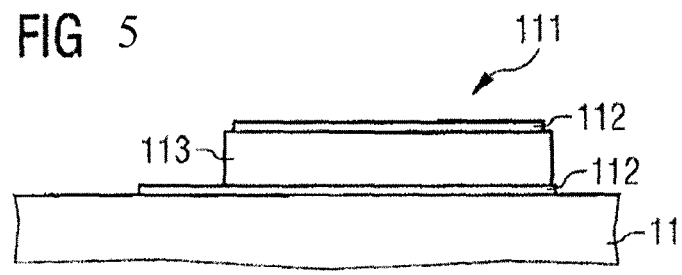

DEVICE WITH A SANDWICH STRUCTURE FOR DETECTING THERMAL RADIATION, AND METHOD FOR THE PRODUCTION THEREOF

BACKGROUND OF THE INVENTION

1. Field of the Invention

The invention relates to a device for detecting thermal radiation of the type having at least one thermal detector element to convert the thermal radiation into an electrical signal, as well as to a method of production of the device.

2. Description of the Prior Art

A device for the detection of thermal radiation is known from, for example, DE 100 04 216 A 1. This device is described as a pyro-detector. The detector element is a pyro-electrical detector element. It has a layer construction composed of two electrode layers with a pyro-electrical layer having pyro-electrical sensitive material arranged between the electrode layers. This material is Lead Zirconate Titanate (PZT). The electrodes are formed of, for example, platinum or of a heat-absorbing chromium/nickel alloy. The thermal detector element is connected to a detector support made of silicon (silicon-wafer). To provide electrical and thermal insulation between the detector element and the detector support an insulating layer is arranged between the detector element and the detector support. The insulating layer has an evacuated cavity which extends over an area of the detector element, a support layer for the cavity and a cover over the support layer and the cavity. The support layer comprises poly-silicon. The cover is made of a boron-phosphorus-Silicate glass (BPSG). To read out, process and/or further transmit the electrical signals produced by the detector element a read-out circuit is integrated in the detector support. The read-out circuit is produced by the application of CMOS (Complementary Metal Oxide Semiconductors) technology.

A comparable device for the detection of thermal radiation is known from DE 195 25 071 A1. The thermal detector element is also a pyro-electrical detector element as described above. The detector element is arranged on a multi-layer detector support. The detector element is applied to a silicon layer of the detector support at one of its electrode layers. The silicon layer is located on an electrically insulating membrane of the detector support. The membrane is formed as, for example, a triple layer—namely $Si_3N_4/SiO_2/Si_3N_4$. Once again, the membrane is applied to a silicon substrate of the detector substrate. The silicon substrate has a radiation window (detection window) with an area which for all practical purposes corresponds with an area of the pyro-electrical detector element. The radiation window is an aperture in the silicon substrate. Thereby, the support material (silicon) of the substrate is removed down to the membrane. The thermal radiation passes through the radiation window to the detector element where it produces an electrical signal which can be evaluated. The membrane thus provides a suitable means of transmission of the thermal radiation. In the silicon layer displaced laterally relative to the detector element a read-out circuit for the electrical signal is integrated. The detector support also functions as a circuit support for the read-out circuit.

In the case of the known detectors a number of detector elements may be provided (detector array). In that situation the electrical signal from each of the detector elements is to be read out separately. Normally, electrical contact with the electrode layers of each of the detector elements is effected by bonding wires. However, this means that considerable space is required for the wiring of the detector elements which results in a limited, relatively low packing density of the detector elements (number of detector elements per unit area of the detector support).

SUMMARY OF THE INVENTION

An object of the invention is to provide a compact device for detecting thermal radiation which, in comparison with prior art, has a lower space requirement.

This object is achieved in accordance with the invention by a device for the detection of thermal radiation having a stack with at least one detector support with at least one thermal detector element to convert the thermal radiation into an electric signal, at least one circuit support with at least one read-out circuit to read out the electric signal, and at least one cover to shield the detector element. The detector support and the cover are arranged with respect to one another so that, between the detector element of the detector support and the cover, at least one first stack cavity bounded by the detector support and the cover is provided, and the circuit support and the detector support are arranged with respect to one another so that, between the detector support and the circuit support, at lest one second stack cavity bounded by the circuit support and the detector support is provided, and the first stack cavity and/or the second stack cavity is evacuated or can be evacuated.

The above object also is achieved in accordance with the invention by a method to produce a device for the detection of thermal radiation, that includes the following steps: a) provision of at least one detector support with at least one thermal detector element to convert the thermal radiation into an electric signal, provision of at least one circuit support with at least one read-out circuit to read out the electric signal and provision of at least one cover to shield the detector element, b) firm binding together of the detector support, the circuit support and the cover to form a stack wherein the detector support is arranged between the circuit support and the cover, and to form, between the detector element of the detector support and the cover, at least one first hollow stack volume bounded by the detector support and the cover, and wherein the circuit support and the detector support are so arranged with respect to one another to form, between the detector support and the circuit support, at least one second hollow stack volume bounded by the circuit support and the detector support, and the first stack cavity and/or the second stack cavity is evacuated or can be evacuated.

According to the invention a compact, space-saving 'sandwich' structure comprising the detector support, the circuit support and the cover can be realised. The detector element is protected from harmful environmental influences by the cover. Such environmental influences are, for example, dust, moist air or a corrosive chemical which attacks a constituent part of the detector element or adversely affects the function of the detector element. The evaluation circuit can be directly integrated into the circuit support by, for example, CMOS-technology. It is also conceivable that the circuit support provides only one lead connecting with the detector element. This wire electrically connects the detector element with an internal ASIC (Applied Specific Integrated Circuit or application-specific integrated circuit) or with an external ASIC. The external ASIC can be bonded. It is advantageous if contact with the external ASIC is made by means of "Flip-Chip" technology (see below). The stack cavities ensure that to a large extent the detector element is thermally decoupled from the circuit support and the cover.

The thermal radiation to be detected has a wave length of more than 1 µm. Preferably, the wavelength is selected from the range between 5 and 15 μm. The thermal detector element is based on, for example, the Seebeck Effect. Preferably, the thermal detector element is a pyro-electrical detector element. As described initially, the pyro-electrical detector element comprises a pyro-electrical layer with a pyro-electrically sensitive material with electrode materials applied to either side. The pyro-electrically-sensitive material is, for example, a ceramic such as Lithium Niobate ($LiNbO_3$) or Lead Zirconate Titanate. A conceivable alternative is a ferro-electrical polymer such as Polyvinylidene Fluoride (PVDF). The electrode materials for the electrode layers can be, for example, platinum or a platinum alloy. A chrome-nickel electrode is also conceivable as is an electrode of an electrically-conductive oxide. Typically, the detector element has a rectangular area with an edge length of 25 μm to 200 μm.

Independent of the effect that is used to detect the thermal radiation, it is necessary in every instance for the thermal radiation to be absorbed by a thermally-sensitive material forming the detector element which releases the relevant effect. The absorption is effected directly by the thermally sensitive material. However, it is also conceivable that the thermal radiation is absorbed by an electrode or electrode layer of the detector element. Furthermore, it is also possible that the thermal radiation is absorbed by an absorption object immediately adjacent to the detector element after which a quantity of heat picked up in this way is transferred by convection or conduction to the thermally sensitive material. The absorption object acts as an energy transmitter.

For example, the absorption object is applied directly to the detector element in the form of a coating.

Preferably, the stack in the device for the detection of thermal radiation is designed so that the thermal radiation impinges directly on the detector element. With that in mind, in a particular embodiment the detector support, the circuit support and/or the cover have at least one radiation window with a transmission performance appropriate to the thermal radiation so that the thermal radiation may irradiate the detector element. The radiation window is integrated in the cover, in the detector support and/or in the circuit support. The detector element and the radiation window are arranged with respect to one another so that the irradiation of the detector element is effected by a front face of the detector element turned away from the detector carrier (front face radiation) and/or from a rear face of the detector element turned towards the detector element (rear face radiation). The radiation window has a particular transmission capacity in the direction of the detection element. The transmission rate is as high as possible and, for example, amounts to at least 50% and, in particular, to between 70% and almost 95%. Any preferred material can be used for the detector support, the circuit support or the cover. Semi-conducting materials, for example, elementary germanium or different semi-conducting compounds are particularly suitable because of the possibility of the integration of electrical circuits or components. In accordance with a particular embodiment the circuit support and/or the cover is/are formed of silicon. In each case a silicon substrate is used as a cover, a circuit support and a detector support. CMOS-technology can be employed to integrate chosen structures and functionalities into the substrate. Since silicon has a low absorption coefficient with respect to the thermal radiation the radiation window can, moreover, be very easily integrated in a silicon substrate: the silicon-substrate itself forms the radiation window. By means of a suitable arrangement of the corresponding functionalities in the silicon substrate it is possible for the thermal radiation to impinge upon the detector element in an unhindered manner, i.e. free from shadow.

The transmission performance does not depend solely upon the absorption coefficient of the material of which the radiation window is made. Another decisive factor is the thickness of the radiation window. It is advantageous if the radiation window forms a thinned area of the detector support or circuit support. In a particular embodiment, the detector element is arranged to be opposite an aperture in the circuit support or an aperture in the cover. Both the aperture in the circuit support and the aperture in the cover are in an area of the circuit support or the cover which has a relatively low thickness. In these areas the circuit support and the cover are reduced in thickness, as a result of, for example, the removal of material. The apertures form the radiation window which is integrated in the circuit support or the cover and through which the thermal radiation impinges upon the detector element. Preferably the detector element is distanced somewhat from each of the apertures. The aperture in the cover is a constituent part of the first stack cavity between the detector support and the cover. The aperture in the circuit support is a constituent part of the second stack cavity between the detector support and the circuit support.

In a particular embodiment the detector support and the circuit support and/or the detector support and the cover are firmly joined together by a permanent material bond and in particular, a hermetically-sealed permanent material bond. To achieve firm bonding of the detector support and the circuit support and/or firm bonding of the detector support and the cover a permanent material bond is manufactured. The permanent material bond is so designed that stack cavities are formed which are capable of being evacuated. Components of the stack which find themselves in the stack cavities, for example, the detector element are protected from the environment by the hermetic permanent material bond. No exchange of material with the surrounding environment can take place. This allows the device to be used in an aggressive environment. Because of the hermetic permanent material bond the stack cavities can be evacuated. This increases the sensitivity to the detected thermal radiation The permanent material bonds between the detector support and the cover and between the detector support and the circuit support can be made consecutively or simultaneously. Each permanent material bond can be formed of any preferred material, for example, an adhesive. It is particularly advantageous to insert an electrically-conducting connection between the electrode layers of the detector element and the read-out circuit at the same time that the permanent material bond is put in place. To that end in a particular embodiment the permanent material bond has an electrically-conductive material. This relates particularly to the permanent material bond between the circuit support and the detector support and the circuit support. However, a permanent material bond with conductive capability can be advantageous when located between the cover and the detector element if wiring components for the detector element are integrated into the cover.

The so-called 'Flip-Chip' technology is predestined for the manufacture of the permanent material bond. By this is understood an assembly method associated with construction and connection technology (AVT), which above all else has proved itself effective in the field of electronics for producing contacts with semi-conductor micro-chips or integrated circuits in non-housed form. Using Flip-Chip technology a chip without any connecting wires is mounted directly on the substrate with an active contact side facing downwards (circuit support). Permanent fixing is effected by means of so-called 'bumps' made of electrically-conductive material. This results in very short lead lengths. This is exploited by the present invention: it results in a compact assembly. Moreover, as a consequence of the very short lead lengths undesirable scatter inductivity- and capacitance effects which interfere with the electrical signals to be read out are reduced to a minimum. This influence operates in a particularly advantageous manner when there are a relatively small number of detector elements to be connected up. With the help of the Flip-Chip technology, moreover, a number of electrical connections can be made simultaneously which results in enormous savings in cost and time.

Different techniques can be employed to implement the 'Flip-Chip' technology and, as a consequence, the manufacture of the permanent material bond. In a particular embodiment one of the group comprising adhesion-, soldering- and/or bonding methods can be selected for use. In that context adhesive bonding or eutectic bonding are both conceivable. In the case of soldering, solder bumps (soldering spheres) are applied to one or both of the support features or components of the device to be joined together. The named methods are preferred in comparison with adhesion since when an adhesive is used out-gassing of organic substances (solvents, adhesive material, . . . ) can occur. Particularly in relation to the evacuation of the cavities this is a factor to be borne in mind. Nevertheless, it can be necessary or advantageous to have recourse to the use of an adhesive.

When using an adhesive a number of different options are available: adhesion can be effected by using an adhesive which is not electrically conducting. In that situation, bumps are applied to the contact areas of the appropriate support features. The bumps are formed, for example, aluminium or gold. After that a layer of the adhesive is applied to the support and the appropriate element arranged on the adhesive layer. As it dries, the adhesive shrinks and forms the electrical contacts.

Alternatively, an anisotropic conductive adhesive can be used. An anisotropic conductive adhesive is a bonding material which comprises an electrically non-conductive adhesive with a low content of electrically-conductive particles. The anisotropic conductive adhesive is placed upon the contact areas of the support feature. As a result of the low content of electrically-conductive particles they are not in contact with one another after the adhesive has been applied. No electrically-conductive contact is made. When the object is placed in position the non-electrically-conductive adhesive is compressed until the particles between the contact areas of the support feature and the contact areas of the applied object are forced together, thereby producing an electrically-conductive join between the contact areas.

In accordance with a particular embodiment of the method during and/or after firm attachment is being made the first stack cavity and/or the second stack cavity is evacuated. For example, the manufacture of the permanent material bond between the constituent parts of the stack takes place under vacuum. The relevant stack cavity is evacuated as the permanent material bond is formed. It is also conceivable for the cavity stack to be formed first and then be evacuated subsequently. It should also be noted here that the stack cavities can be evacuated one after the other or simultaneously. In the case of simultaneous evacuation the stack cavities can be connected under isobaric conditions. This means that the same pressure exists in both stack cavities.

The device can have a single detector element. Having regard to the device being used as a presence recorder or, in particular, as a heat-sensitive camera it is however, desirable and even necessary that several detector elements are provided. In a particular embodiment, therefore, at least one array with several detector elements is provided. This means one detector element represents a pixel in the array. The detector array is characterised by, for example, a columnar- and/or linear arrangement of the detector elements. In the case of a linear- or a columnar arrangement the detector elements are distributed in one dimension in a particular direction. In the case of a columnar- and a linear arrangement the distribution is of a two-dimensional nature. The detector array comprises, for example, 240×320 individual elements. This corresponds to the relatively low resolution standard QVGA. It is also conceivable to choose an area-type distribution of the detector elements. A radiation window can be provided for each detector element. It is advantageous, however, if the device has a single radiation window for several or all of the detector elements. This allows the manufacture of the device to be simplified.

In accordance with a further embodiment the device has a casing feature. The stack is arranged within a casing. The casing protects the stack and its component parts against harmful environmental influences, for example, moisture—and also against mechanical damage. The one point to be ensured here is that the radiation falling on the detector element is not adversely affected by the casing. To that end, a radiation window permitting a high rate of transmission of thermal radiation is integrated into the casing.

The casing may be formed as a housing made of any chosen material. Preferably, the housing is a casting compound. To provide the casing one of the group of injection moulding methods or moulding methods may be used. These methods are particularly advantageous on cost grounds. The method involves applying non- or partially cross-linked synthetic material to the stack. Then the synthetic material is thermally induced or hardened by exposure to UV light. To integrate the radiation window a mask is used, for example, which is removed once the synthetic material has been put in place or after that material has been hardened. This is achieved by using, for example, transfer moulds fitted with a spring-loaded insert. It is also conceivable to employ a radiation window fabricated from a material which has a higher transmission rate for thermal radiation and which remains in the casing after the synthetic material has been put in place and hardened.

The described method can be used to manufacture a single device for the detection of thermal radiation. It is advantageous, however, if several devices are manufactured at the same time in parallel. The manufacture is useful. In a particular embodiment, therefore, a number of devices for the detection of thermal radiation are manufactured at wafer-level. When manufacture is complete the devices or the stacks of the devices are separated. The three support features, i.e. the detector support, the circuit support and the cover are brought together as described above in a sandwich construction as wafers, and particularly as silicon wafers each having appropriate constituents and functionalities. The stacks are separated from one another after or, preferably, before the application of the casing. The separation or division takes place by, for example, sawing, erosion, or similar methods. When separation is complete a casing is applied to each of the stacks of the devices.

In accordance with a further aspect of the invention the device is used as a movement reporter, a presence reporter and/or as a thermal imaging camera. For a movement reporter a device with a single detector element can be adequate. For a presence reporter the device can be fitted with several detector elements. For the thermal imaging camera, the device needs a large number of detector elements, for example, 240×320 detector elements (to qualify for the QVGZ standard). This can be achieved by using the simple and space-saving wiring technique for the detector elements.

In summary, the invention has the following advantages:
The device for the detection of thermal radiation is compact.
Because of the sandwich construction a number of detector elements can be connected in a space-saving manner.
The electrical leads between the electrodes of a detector element and the assigned read-out circuit or read-out element are short. Inductive- and capacitance-effects which lead to interference which affect the detection capability of the detector elements are clearly reduced by comparison with bonded wires.
By virtue of the way in which contacts are made it is possible to introduce a high degree of parallelisation into the manufacturing operation.
Because of the hermetic permanent material bond, access is easy to the cavities which are capable of being evacuated and lead to improved sensitivity of the device and to protection of the detector elements.

BRIEF DESCRIPTION OF THE DRAWINGS

With reference exemplified embodiments and the associated figures, a device for the detection of thermal radiation will be presented. The Figures are of a schematic nature and are not to scale.
FIG. 2 shows the device for the detection of thermal radiation given in FIG. 1 along the cross-section surface B-B looking towards the cover.
FIG. 3 shows the device for the detection of thermal radiation from FIG. 1 along the cross-section surface A-A looking towards the detector support.
FIG. 4 shows the device for the detection of thermal radiation from FIG. 1 along the cross-section area A-A looking towards circuit support.
FIG. 5 shows the detector element upon a detector support seen in cross-section.

DESCRIPTION OF THE PREFERRED EMBODIMENTS

Figure 1:
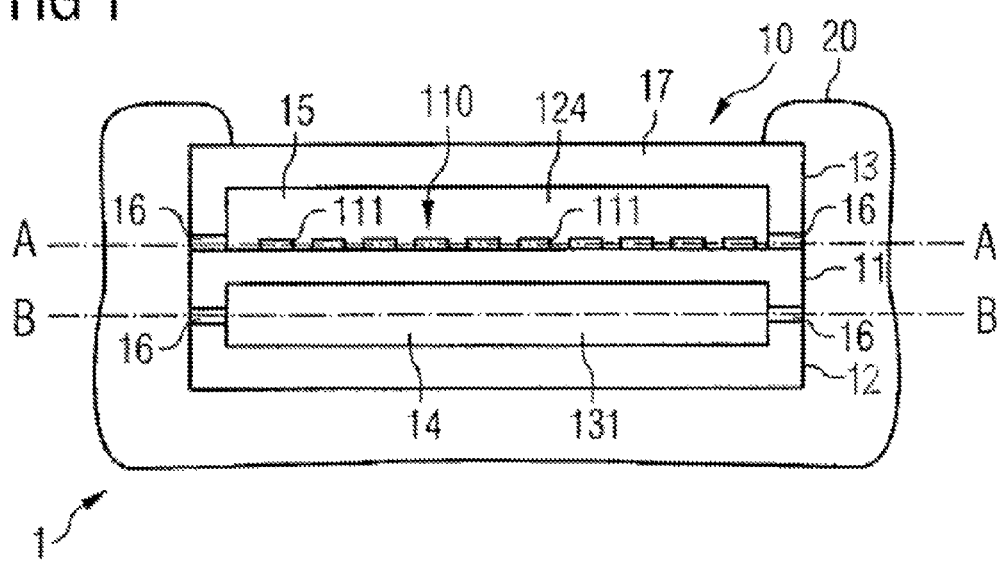
FIG. 1 shows a device for the detection of thermal radiation in cross-section.

The device 1 for the detection of thermal radiation has a stack 10 with a detector support 11 with a detector array 110 of detector elements 111 for the conversion of thermal radiation into electric signals, a circuit support 12 with a read-out circuit 121 for reading-out the electric signals and at least one cover 13 to shield the detector elements. The detector support and the cover are so arranged with respect to one another that between the detector elements of the detector support and the cover there is a first stack cavity 14 in the stack between the detector element of the detector support and the cover which is bounded by the detector support and the cover. In addition, the circuit support and the detector support are so arranged with respect to one another that between the detector support and the circuit support there is at least one second stack cavity 15 bounded by the detector support and the circuit support. The first stack cavity and/or the second stack cavity is evacuated.
The detector elements are pyro-electrical detector elements of a thin-layer construction with two electrode layers 112 and a pyro-electrical layer 113 arranged between the electrode layers (FIG. 5). The pyro-electrical layer is a layer of PZT about 1 µm thick of a pyro-electrically-sensitive nature. The electrode layers are made of platinum and a chrome-nickel alloy about 20 nm thick.

The read-out circuit has a read-out element 122 arranged on the circuit support in the form of an ASIC. In accordance with a non-illustrated embodiment the read-out element is integrated in the circuit support.
The detector support, the circuit support and the cover are silicon substrates. The detector elements are arranged within the second stack cavity opposite an aperture 124 in the circuit support. In the area of the aperture n the circuit support is arranged a common radiation window 17 through which the radiation impinges upon the detector elements. The radiation passes through from the front side. In accordance with a non-illustrated alternative embodiment the radiation emerges from the rear side. For that reason a suitable radiation window is provided in both the cover and the detector support.
An aperture 131 in the cover 14 is provided. However, this cover aperture is not necessarily required as indicated by the dotted line shown in FIG. 1.
Both the detector support and the cover and the detector support and the circuit support are all firmly bonded together by a hermetic permanent material bond 16. In accordance with a first embodiment the permanent material bond comprises a solder material. Alternatively, the permanent material bond is produced by bonding. The supports are joined together by adhesive.
Electrical wiring 123 to the detector elements is provided so that it extends between the circuit support and the detector support via the permanent material bond. The electrical signals from the detector element are read-out from the wiring or the read-out circuit. Alternatively, the wiring is created by Flip-Chip.
During the manufacture of the permanent material bonds vacuum is applied so that an under-pressure develops in the cavities being created. The cavities in the stack are evacuated while they are being formed. Alternatively, the cavities in the stack are evacuated after the permanent material bonds have been produced.
Once the stack has been produced it is provided with a casing 20. A non-cross-linked synthetic material is applied to the stack by an injection molding technique and subsequently cross-linked. Alternatively, a molding technique can be used. In that context care must be taken to ensure that the radiation window in the cover remains free, i.e. that window is not covered up.
To manufacture the device the detector support with the detector array, the circuit support with the read-out circuit and the cover are prepared and firmly connected together as described above. The next stage of manufacture is carried out at wafer level. Silicon wafers are provided with a number of appropriate functionalities (detector arrays, read-out circuits, cover apertures). Detector supports, circuit supports and covers are prepared at wafer level. These functionalised silicon wafers are firmly connected together as described above. A wafer stack containing a number of individual stacks is produced. After the connection activity has been concluded the individual stacks are separated by sawing through the wafer stack and then each of them is provided with a casing.
The device finds application in a motion detector or a presence detector. For application in a thermal imaging camera a plurality of stacks or of devices is provided, each device having one stack.
Although modifications and changes may be suggested by those skilled in the art, it is the intention of the inventors to embody within the patent warranted hereon all changes and modifications as reasonably and properly come within the scope of their contribution to the art.

We claim as our invention:

1. Device for detecting thermal radiation, having a stack comprising:
    at least one detector support with at least one thermal detector element in said stack that converts thermal radiation into an electric signal;
    at least one circuit support in said stack with at least one read-out circuit in said stack to read out the electric signal;
    at least one cover that shields the detector element; wherein:
    the detector support is arranged between the circuit support and the cover;
    the detector support and the cover are arranged with respect to one another to form at least one first stack cavity, bounded by the detector support and the cover, between the detector element of the detector support and the cover;
    the circuit support and the detector support are arranged with respect to one another to form at least one second stack cavity, bounded by the circuit support and the detector support, between the detector support and the circuit support; and
    the detector support and the circuit support and/or the detector support and the cover are respectively connected by a hermetically sealed permanent material bond such that the first stack cavity and/or the second stack cavity form an evacuated space.

2. Device according to claim 1, wherein the detector support, the circuit support and/or the cover have at least one radiation window with a specific transmission capacity for the thermal radiation to irradiate the detection element with the thermal radiation.

3. Device according to claim 1, wherein the detector support, the circuit support and/or the cover have silicon.

4. Device according to claim 3, wherein the detector element is arranged opposite to an aperture in the circuit support or opposite an aperture in the cover.

5. Device according to claim 1, wherein the detector support and the circuit support and/or the detector support and the cover are connected by a permanent material bond.

6. Device according to claim 5, wherein the permanent material bond comprises an electrically-conductive material.

7. Device according to claim 1, comprising at least one detector array with a plurality of said detector elements.

8. Device according to claim 1, wherein the stack comprises a casing.

9. Device according to claim 8, wherein the casing comprises a casting mass.

10. Device according to claim 1, wherein the read-out circuit is directly integrated into the circuit support with CMOS technology.

11. Device according to claim 1, wherein the cover, the circuit support and the detector support respectively comprise a silicon substrate.

12. Device according to claim 1, wherein the cover, the circuit support and the detector support of the stack collectively define a sandwich structure.

13. Method of production of a device for detecting of thermal radiation comprising:
    providing at least one detector support with at least one thermal detector element to convert thermal radiation into an electric signal;
    providing at least one circuit support with at least one read-out circuit to read out the electric signal;
    providing at least one cover to shield the detector element;
    firmly bonding the detector support, the circuit support and the cover to form a stack;
    arranging the detector support between the circuit support and the cover, in said stack;
    arranging the detector support and the cover in said stack with respect to one another to form a first stack cavity bounded by the detector support and the cover, between the detector element of the detector support and the cover;
    arranging the circuit support and the detector support with respect to one another to form at least one second stack cavity, bounded by the circuit support and the detector support between the circuit support and the detector support; and
    evacuating and hermetically sealing the first stack cavity and/or the second stack cavity.

14. Method according to claim 13, comprising producing a permanent material bond to secure firm bonding of the detector support and the circuit support and/or to secure the first bonding of the detector support and the cover.

15. Method according to claim 13 comprising during and/or after the firm bonding, the first stack cavity and/or the second stack cavity is evacuated.

16. Method according to claim 13 comprising arranging a casing around the stack.

17. Method according to claim 16, comprising implementing said bonding by a method selected from the group consisting of injection molding end.

18. Method according to claim 13 comprising manufacturing a plurality of devices for the detection of thermal radiation at wafer-level and when the manufacturer has been completed, separating the individual devices from one another.

19. Method according to claim 13 comprising permanently bonding said stack using a technique selected from the group consisting of adhesion, soldering and bonding to form a permanent material bond.

20. Method according to claim 13, further comprising integrating the read-out circuit into the circuit support using CMOS technology.

* * * * *